United States Patent [19]
Erbil

[11] Patent Number: 4,915,988
[45] Date of Patent: Apr. 10, 1990

[54] CHEMICAL VAPOR DEPOSITION OF GROUP IIA METALS AND PRECURSORS THEREFOR

[75] Inventor: Ahmet Erbil, Atlanta, Ga.

[73] Assignee: Georgia Tech Research Corporation, Atlanta, Ga.

[21] Appl. No.: 209,999

[22] Filed: Jun. 22, 1988

[51] Int. Cl.$^4$ ............................................. G23C 16/00
[52] U.S. Cl. .................................. 427/252; 427/255;
427/255.1; 427/255.2; 427/255.3; 427/314;
556/22; 556/112; 556/116
[58] Field of Search .................... 427/39, 40, 226, 229,
427/252, 255, 255.1, 255.2, 255.3, 313, 314, 316,
318, 319, 376.1, 376.4, 383.1, 383.3, 383.5,
383.7, 248; 556/22, 112, 116

[56] References Cited

U.S. PATENT DOCUMENTS

| | | | |
|---|---|---|---|
| 2,976,304 | 3/1961 | DeWitt et al. | 260/429 |
| 2,977,381 | 3/1961 | Roha et al. | 260/448 |
| 2,987,531 | 6/1961 | Shapiro et al. | 260/429 |
| 3,018,194 | 1/1962 | Norman et al. | 117/107 |
| 3,028,406 | 4/1962 | Brantley | 260/439 |
| 3,030,393 | 4/1962 | Bulloff | 260/429 |
| 3,032,569 | 5/1962 | Freeman et al. | 260/429 |
| 3,038,915 | 6/1962 | Barkdoll et al. | 260/429.5 |
| 3,061,464 | 10/1962 | Norman et al. | 117/107 |
| 3,061,465 | 10/1962 | Norman et al. | 117/107 |
| 3,064,020 | 11/1962 | Riemschneider | 260/429 |
| 3,071,493 | 1/1963 | Whaley et al. | 117/107 |
| 3,071,605 | 1/1963 | Morehouse | 260/429 |
| 3,080,305 | 3/1963 | Gorsch | 204/158 |
| 3,089,886 | 5/1963 | Breederueld et al. | 260/429.5 |
| 3,099,689 | 7/1963 | Cragg | 260/561 |
| 3,114,652 | 12/1963 | Schetky | 117/93.1 |
| 3,152,157 | 10/1964 | Shapiro et al. | 260/438 |
| 3,175,924 | 3/1965 | Norman et al. | 117/107.2 |
| 3,188,230 | 6/1965 | Bakish et al. | 117/107.2 |
| 3,253,946 | 5/1966 | Kozikowski et al. | 117/107.2 |
| 3,259,642 | 7/1966 | Schenck et al. | 260/429 |
| 3,288,829 | 11/1966 | Wilkinson | 260/429 |
| 3,294,654 | 12/1966 | Norman et al. | 204/38 |
| 3,328,440 | 6/1967 | Shapiro et al. | 260/429 |
| 3,426,052 | 2/1969 | Hubel et al. | 260/429 |
| 3,673,232 | 6/1972 | Talbot et al. | 260/439 |
| 3,914,515 | 10/1975 | Kane et al. | 428/432 |
| 4,359,490 | 11/1982 | Lehrer | 427/95 |
| 4,483,694 | 11/1984 | Takumura et al. | 427/40 |
| 4,496,610 | 1/1985 | Cattell et al. | 427/66 |
| 4,720,560 | 1/1988 | Hui et al. | 556/1 |

OTHER PUBLICATIONS

Wilkinson, G. et al., *J. Inorganic and Nuclear Chemistry*, vol. 2, 1956, pp. 32–37.
Hawley, G. G., "The Condensed Chemical Dictionary", 10th Ed., 1981, p. 789, published by Van Nostrand Reinhold, N.Y.
Reynolds, L. T. et al., *J. Inorg. Nuol. Chem.*, vol. 9, pp. 86–92, (1959).
Tsang, W. T., *Appl. Phys. Lett.*, 1984, vol. 45, pp. 1234–1236.
Fischer, E. O. and Werner, H., *Chemische Berichte*, 1960, vol. 93, pp. 2075–2082 (in German).
Fischer, E. O. and Werner, H., *Chemische Berichte*, 1962, vol. 95, pp. 695–702 (in German).
Green, M. L. and Levy, R. A., *Journal of Metals*, Jun. 1985, pp. 67–71.

Primary Examiner—Stan Silverman
Attorney, Agent, or Firm—Oldham & Oldham Co.

[57] ABSTRACT

Coatings of Group IIA metals and compounds thereof are formed by chemical vapor deposition, in which a heat decomposable organometallic compound of the formula (I)

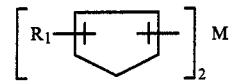

where M is a Group IIA metal, preferably magnesium, calcium, strontium, or barium and R is a lower alkyl or alkenyl radical containing from 2 to about 6 carbon atoms, with a heated substrate which is above the decomposition temperature of the organometallic compound. The pure metal is obtained when the compound of the formula I is the sole heat decomposable compound present and deposition is carried out under nonoxidizing conditions. Intermetallic compounds such as barium selenide can be deposited from a barium compound of formula I and a heat decomposable selenium compound under nonoxidizing conditions. Group II metal oxides and salts, such as barium titanate, are obtainable by deposition from a compound of formula I (and an additional titanium organometallic compound (I)) under oxidizing conditions.

16 Claims, No Drawings

CHEMICAL VAPOR DEPOSITION OF GROUP IIA METALS AND PRECURSORS THEREFOR

TECHNICAL FIELD

This invention relates to processes for forming a thin metallic coating on a heated substrate by decomposition of a thermally decomposable organometallic compound, and to thermally decomposable organometallic compounds used in such processes.

BACKGROUND ART

Chemical vapor deposition has been extensively described in the literature (including patents) as a technique for depositing a thin metallic coating on a heated substrate. Basically, a heat decomposable volatile metal compound (usually an organometallic compound), which may be called the precursor, is contacted with a substrate which has been heated to a temperature above the decomposition temperature of the metal compound. The metallic coating may be a metal, metal mixture or alloy, or metal compound or mixture thereof, depending on the choice of precursor(s) and reaction conditions.

While the technique has been described with reference to most transition metals and to certain other metals and metalloids (silicon, for example), commercial use of CVD for the most part has been confined to deposition of a few metals and metal compounds, such as silicon, tungsten, and certain III-V and II-VI compounds (denoting, respectively, a compound of a Group III metal and a group V element, and a compound of a Group II metal and a Group VI element). The absence of suitable heat decomposable organometallic compounds for elements other than those mentioned above appears to have limited the extension of CVD to the deposition of other metals or compounds.

DISCLOSURE OF THE INVENTION

According to one aspect of this invention, a metallic coating is formed on a heated substrate by contacting a heat decomposable organometallic compound having the formula (I)

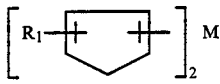

where M is magnesium, calcium, strontium or barium, or a mixture thereof, and R is a lower alkyl or alkenyl radical containing from 2 to about 6 carbon atoms, with the substrate, which is at a temperature above the decomposition temperature of the organometallic compound.

M is preferably calcium, strontium or barium. R is preferably lower alkyl, especially a lower alkyl radical containing from 2 to 4 carbon atoms.

The metallic coating may contain one or more metals, or one or more metal compounds. At least one constituent of the coating (where more than one chemical species is present) is a Group IIA metal or metal compound. A coating of essentially pure metal M is obtained when a single organometallic compound or precursor as above defined is the sole reactant and is contacted with the substrate under nonoxidizing and preferably reducing conditions. Additional reactants are required where a coating of two or more metals, or a coating containing one or more metal compounds, is desired. This will be discussed subsequently in further detail.

This invention according to another aspect thereof, provides the aforesaid organometallic compounds as novel compounds.

The phrase "Group IIA" metal herein refers only to magnesium, calcium, strontium or barium.

BEST MODE FOR CARRYING OUT THE INVENTION

The heat decomposable organometallic compounds which are used as precursors in the practice of this invention meet the following requirements: (1) they are liquids at 100° C., (i.e. the melting points are below 100° C.); (2) they have vapor pressures of at lest 0.1 torr at 100° C.; (3) they clearly decompose to deposit metal with little or no carbon incorporation (i.e., not more than about 5 percent by weight of carbon in the metal); (4) they are thermally stable at temperatures below about 150° C.; and (5) they thermally decompose with the deposition of metal at a temperature from about 150° to about 1000° C.

The low melting points and the large temperature difference between the melting point and the decomposition temperature of precursor compounds used herein make it possible to disperse the liquid precursors into a carrier gas stream at convenient operating temperatures without risk of premature decomposition. High vapor pressure at 100° C., assures a sufficiently high concentration of precursor in carrier gas for effective metal oxide deposition. The thermal decomposition temperatures of the precursors are low enough for economical operation, with few if any requirements for special high temperature resistant equipment in most cases. Finally, precursors herein give highly pure deposits under suitable deposition conditions.

The precursors used herein meet the above requirements and generally have lower melting points and higher vapor pressures at 100° C., and usually have greater temperature differences between the melting point and the decomposition temperature than their cyclopentadienyl metal analogs in which the cyclopentadienyl radical is unsubstituted.

Precursors for depositing Group IIA in metals in accordance with this invention are compounds of formula (I) as aforedescribed.

The metal M in the organometallic compounds of formula (I) may be magnesium, calcium, strontium or barium, preferably calcium, strontium or barium.

The aliphatic substituent $R_1$ on the cyclopentadienyl radical contains from 2 to about 6 carbon atoms, preferably 2 to about 4 carbon atoms, and may be either alkyl or alkenyl. Suitable alkyl substituent include ethyl, propyl, isopropyl, butyl, isobutyl, sec-butyl, t-butyl, pentyl and hexyl. Suitable alkenyl substituents include vinyl, allyl, isopropenyl, 1-butenyl, 2-butenyl and 3-butenyl. The alkyl substituents are preferred. The alkyl or alkenyl substituent $R_1$ imparts higher volatility, so that the organometallic compounds of this invention have lower boiling points and higher vapor pressures at 100° C. than do the analogous unsubstituted cyclopentadienyl compounds (those of the formula I above except that $R_1$ is hydrogen).

Representative organometallic precursor compounds of formula (I) which are suitable for depositing Group IIA metal and transition metal (Groups IIIB to VIII) oxides include the following:
bis(isopropylcylopentadienyl) magnesium,
bis(isopropylcyclopentadienyl) calcium,
bis(isopropylcyclopentadienyl) strontium,
bis(ethylcyclopentadienyl) barium,
bis(isopropylcyclopentadienyl) barium,
bis(butylcyclopentadienyl) barium, and
bis(tert.-butylcyclopentadienyl) barium. Ethyl, propyl, butyl, isobutyl, sec.-butyl, tert.-butyl, pentyl (all isomers) and hexyl (all isomers) homologs of the above compounds are also suitable.

GENERAL METHOD FOR PREPARING PRECURSORS

Organometallic precursor compounds of Formula (I) can be prepared by the general method described below. This method proceeds according to the following equations (1) through (3)

$$C_5H_6 + Na \rightarrow NaC_5H_5 + 1/2\ H_2 \quad (1)$$

$$NaC_5H_5 + R_1Br \rightarrow R_1C_5H_5 + NaBr \quad (2)$$

$$2R_1C_5H_5 + M, \rightarrow (R_1C_5H_4)_2M_1 + H_2 \quad (3)$$

Sodium cyclopentadienide may be prepared according to equation (1) by reacting monomeric 1,3-cyclopentadiene in an inert solvent such as tetrahydrofuran (THF) with an excess of metallic sodium. The resulting sodium cyclopentadienide may be reacted in another vessel (away from excess sodium) with a lower alkyl bromide (e.g. isopropyl bromide) according to equation (2) by adding the alkyl bromide through a dropping funnel. The resulting sodium bromide is allowed to settle. The alkylcyclopentadiene solution produced may be separated from the sodium bromide and the solvent (e.g. THF) by fractional distillation. Finally, the alkylcyclopentadiene (e.g. isopropylcyclopentadiene) may be mixed with an inert gas (e.g. argon) and passed through a quartz tube heated to 500°–600° C. and containing chips of the desired metal (e.g. calcium, strontium or barium). A reaction according to equation (3) ensues, producing a bis(alkylcyclopentadienyl) metal compound, such as bis(isopropylcyclopentadienyl) strontium, which may be represented by formula (I).

It is possible to prepare thin coatings of alloys, mixtures and compounds of Group IIA metals according to this invention. In fact, compounds of calcium, strontium, and barium are generally of greater interest than the free metals. Of particular interest are barium selenide and barium titanate.

Mixtures of Group IIA metals (e.g., a mixture of strontium and barium) can be deposited from a mixture of precursors of formula (I), in which each precursor is a compound of one of the metals.

Barium selenide can be deposited by using as precursors a barium compound of formula (I), such as barium di(isopropylcyclopentadiene), and a heat decomposable organometallic selenium compound, preferably one which meets the general requirements for precursors listed above. (The term "organometallic", as used herein is in accordance with the definition in "The Condensed Chemical Dictionary", 10th edition. Representative selenium precursors are (dimethyl selenide and diethylselenide). Barium telluride can be similarly deposited, except that a heat decomposable tellurium compound, such as diethyltelluride, is used as a precursor in place of the selenium compound. Other II-VI compounds, i.e. binary compounds of calcium or strontium with selenium or tellurium, can be prepared similarly by choosing heat decomposable organic compounds of the desired elements as precursors. Deposition is carried out under nonoxidizing conditions. More broadly, this method can be used to deposit other intermetallic compounds of Group IIA metals. Precursors are one or more Group IIA compounds of formula (I) and heat decomposable organometallic compounds of the desired metals and metalloids other than those of Group IIA. The term, "metalloid" is used to denote the nonmetallic elements arsenic, antimony, boron, germanium, phosphorus, selenium, silicon and tellurium. Deposition is under nonoxidizing conditions, preferably under reducing conditions.

Barium titanate coatings can be formed by using as precursors a barium compound of formula (I) and a heat decomposable organometallic titanium compound. The titanium compound preferably is one which meets the general requirements for precursors listed above. Preferred titanium compounds are titanium alkylcyclopentadienyls such as titanium bis(isopropylcyclopentadienyl), titanium tris(isopropylcyclopentadienyl) and titanium tetra(isopropylcyclopentadienyl). Deposition is carried out in the presence of an oxidizing agent, which is a mildly oxidizing gaseous oxygen source.

The oxidizing agent may be any gaseous reactant which is capable of reacting with the organometallic precursor compound(s) at the decomposition temperatures of the latter to form metal oxide deposits. Oxygen compounds, such as nitrous oxide, carbon dioxide, THF (tetrahydrofuran) and steam, are better suited than oxygen or air to the deposition of metal oxides and oxygen-containing salts because the oxygen compounds react with organometallic compounds only at high temperatures. The oxidizing agent may be introduced into the reactor in admixture with a carrier gas. For example, nitrous oxide/nitrogen and carbon dioxide/hydrogen oxidizing mixtures are suitable.

The above method for preparing barium titanate coatings can be used with appropriate choice of precursors and oxidizing agent, to prepare other coatings containing one or more Group IIA metals, an oxidizing nonmetal (e.g., oxygen, sulfur or a halogen), and optionally one or more additional metals or metalloids (i.e., those not in Group IIA). Examples of such coatings include barium oxides, barium chloride and calcium zirconate, for example. (In general these are oxides and salts of Group IIA metals). Appropriate precursors are one or more Group IIA metal compounds of formula (I) and one or more organometallic compounds yielding the desired additional metals or metalloids. When the oxidizing nonmetal of the coating is other than oxygen (i.e., sulfur or a halogen), an appropriate oxidizing agent, e.g., a sulfite, or a sulfide plus oxygen or an oxygen compound, or a halogen (e.g., chlorine), or a combination of a hydrogen halide (e.g., HCl) plus oxygen or compound yielding oxygen, is chosen.

The substrate can be any material, usually either metallic or ceramic, on which an adherent metallic coating can be formed and which can be heated to a temperature above the decomposition temperatures of the precursor compounds. Thus, the substrate, can be a ceramic material such as glass or quartz, or a metal such as iron, nickel, titanium, tungsten, copper or aluminum. The substrate must be a solid at the decomposition temperature of the precursor. This poses no problems when the melting or softening point of the substrate is above 1000° C. When the desired substrate has a melting or softening point below about 1000° C. (which is the case with aluminum, certain other metals, and most glasses), one must use a precursor compound whose decomposition temperature is lower than the melting or softening point of the desired substrate.

The substrate can be of any desired shape, either regular or irregular. Thus, the substrate can be a rectangular solid or other solid characterized by flat exterior surfaces. Cylindrical surfaces, such as rods and wires, can also be coated according to this invention. Spherical surfaces and other curved surfaces can also be coated. The substrate can even be hollow, as for example, a tube or a hollow sphere having openings to the exterior.

Ductile metallic rods and wires are preferred substrates.

The desired metallic coating can be formed on the desired substrate by methods known in the art. "Metallic" in this connection includes pure metals, mixtures, alloys, and metal compounds (including intermetallic compounds, metal oxides and salts). Conventional chemical vapor deposition (CVD), chemical beam epitaxy (CBE) or metal-organic molecular beam epitaxy (MO-MBE) techniques, and variations thereof, can be used. Broadly, "chemical vapor deposition" or "CVD" includes any process in which a metallic coating is deposited on a heated substrate by decomposition of one or more precursor compounds. In conventional CVD the reactants are carried into the deposition region by carrier gas flow. Where, as here, a metallic coating is to be formed on a heated substrate, it is usually desirable to convey the organometallic precursor compound(s) and the oxidizing agent (where used) to the substrate in separate carrier gas streams in order to avoid premature reaction. In CBE or MO-MBE (these two terms are used synonymously herein), the reactants are introduced as separate streams into a high vacuum chamber and expanded to form molecular beams which are impinged line of sight on to a heated substrate. The molecular beams strike the hot substrate and deposit metals, which may be oxidized by an oxidizing gas stream to the corresponding oxides. Conventional CVD, CBE and MO-MBE techniques have been described in the literature, particularly the literature pertaining to deposition of silicon and III-V and II-VI compounds.

The foregoing processes can be carried out in any apparatus which includes a gas-tight chamber or gas space having means for supporting a substrate, means for heating this substrate to a temperature above the decomposition temperature of the decomposable metal compound, an inlet conduit for admitting gas or vapor streams of decomposable organometallic compound and oxidizing agent, and an outlet conduit for removing a stream of carrier gas, decomposition products and undecomposed metal compound from the chamber. Suitable apparatus of various types are well known in the art.

For CVD processes it is preferred to supply both the organometallic compounds and the oxidizing agent in streams of carrier gas. The preferred carrier gas for the organometallic compounds is hydrogen, argon, nitrogen, or a mixture of these. The desired mole fraction of each organometallic compound can be achieved by bubbling the carrier gas through a body or pool of the liquid organometallic compound at a rate and bubble temperature (which is the same as the pool temperature) which will give the desired mole fraction. The bubbler temperature is typically from the melting point of the organometallic compound to 100° C. The various organometallic compounds are preferably entrained in separate carrier gas streams, which after entrainment are combined into a single carrier gas stream, which is supplied to the reactor in which metal oxide deposition takes place. The mole ratios of the metals in the combined carrier gas stream is typically but not necessarily the same as the mole ratios of the metals in the metal oxide deposit, since metals do not always deposit in the same proportion as that in which they are present in the carrier gas. It is possible to supply the organometallic compounds in undiluted form at reduced pressure (say about 0.1 atmosphere or less) to the reactor, but use of a carrier gas is generally preferred because it affords better process control and does not require high vacuum equipment. The oxidizing agent (e.g., nitrous oxide, carbon dioxide, THF or steam) is also preferably contained in a non-oxidizing carrier gas. For example, nitrous oxide may be diluted with nitrogen, and carbon dioxide and steam can be diluted with hydrogen. Separate streams of organometallic compounds and oxidizing agent are supplied to avoid premature decomposition of the organometallic compounds.

The substrate temperature for all processes according to this invention, whether CVD, MO-MBE (metalorganic molecular beam epitaxy) or CBE (chemical beam epitaxy) is above the decomposition temperature of the organometallic precursor compound having the highest decomposition temperature, and is in the range of 150° C. to 1000° C. For example a suitable substrate temperature for deposition of a barium oxide-yttrium oxide-copper oxide superconductor coating is in the range of 600°-1000° C. regardless of which process is used.

CVD processes using a carrier gas are typically carried out in the pressure range of about 0.1 torr to about atmospheric pressure (760 torr), although higher or lower pressures can be used. MO-MBE or CBE process are typically carried out under high vacuum. For example, in preferred MO-MBE and CBE process, the reactor pressure is typically about $10^{-5}$ torr during crystal growth (i.e., while organometallic compounds are actually being supplied to the substrate), with a typical background pressure from $10^{-10}$ to $10^{-9}$ torr. The low background pressure in MO-MBE allows for fast switching of material composition, which is important in growing ultra thin layers and other multilayer coatings in which there are abrupt composition and sloping changes from layer to layer.

Decomposition products are removed from the reactor in all processes herein described via the outlet provided for that purpose.

Products of this invention may have any desired coating thickness ranging from monomolecular up to about one millimeter. A preferred range of thickness is from about 0.1 to about 100 microns, especially from about 0.1 to about 20 microns. Coating thickness can be controlled by controlling the flow rate of the organometallic compounds and the length of time over which these compounds are supplied. Products of this invention may be characterized as composite articles having a thin metallic coating thereon.

Single layer coatings, usually of substantially uniform composition throughout, can be achieved with any of the processes described herein. Multiple layer coatings having different compositions are best achieved with MO-MBE or CBE.

Epitaxial, polycrystalline and amorphous coatings can all be obtained in accordance with this invention.

Coatings produced according to this invention usually have a high degree of conformality. That is, the thickness of the coating is very nearly uniform even when the substrate has an irregular rough surface. This can be realized by depositing the coating in a surface kinetic limited regime (i.e., under conditions such that surface kinetics limit the deposition rate) at relatively low temperatures.

Processes of this invention offer a range of composite articles, comprising metallic coating or film on a substrate at low cost. High quality films of excellent purity are obtained. Low operating temperatures can be used, since in general the organometallic precursor compounds used herein have lower decomposition temperatures than their unsubstituted cyclopentadienyl metal analogs. Faster metal oxide deposition rates are made possible, particularly in CVD processes, by the relatively high vapor pressures of the organometallic precursor compounds used herein. The relatively wide "window" or temperature range between melting point and decomposition temperature makes the precursor compounds herein easy to handle.

Products of this invention have a number of uses. For example, composite articles having a coating of a II-VI material, such as barium selenide, are useful in semiconductors and photocells. Barium titanate-coated articles are useful in ferroelectric devices, including storage devices, dielectric amplifiers and digital calculators. Other uses include rectifiers, thin film resistors and capacitors, infrared windows and optical elements, long wavelength optical fibers, solar cells, decorative coatings, and optical mirrors and coatings.

This invention will be described further with reference to the following examples.

EXAMPLE 1

Bis(isopropylcyclopentatienyl)strontium:

Sodium cyclopentadienide is prepared by using 30 g of fine sodium beads (a two fold excess) and 50 ml of monomeric cyclopentadiene in 500 ml of tetrahydrofuran (THF). This solution is then transferred to another vessel (away from excess sodium) and stirred while adding 60 ml of isopropyl bromide from a dropping funnel. After completion the NaBr is allowed to settle. The slightly yellow solution containing isopropylcyclopentadiene is then transferred to a still pot for the separation of THF by fractional distillation. Pure isopropylcyclopentadiene thus produced is mixed with prepurified argon and passed downwardly through a vertical quartz tube ½ in o.d. which is heated electrically to 500°-600° C. by an electrical resistance heater in a tube furnace mounted vertically. Strontium metal chips are supported in the quartz tube by a platinum foil with many holes on it at a tube constriction. The product, which flows down the tube walls as a viscous liquid, is collected in a three-necked flask connected to the bottom end of the tube.

The apparatus should be initially charged and dried with pure argon. The product produced by this method is quite pure. It can be made even purer by further distillation.

EXAMPLE 2

The procedure of Example 1 is followed except that an equivalent quantity of each of the following is substituted in turn for isopropyl bromide: ethyl bromide, n-propyl bromide, butyl bromide, isobutyl bromide, pentyl bromide, hexyl bromide, vinyl bromide, allyl bromide, and 3-butenyl bromide. The corresponding homolog or analog of bis(isopropylcyclapentadienyl)strontium, e.g., bis(ethylcyclopentadienyl)strontium, etc., is obtained.

EXAMPLE 3

The procedure of Example 1 is followed except that magnesium turnings, calcium chips and barium chips are substituted in turn for strontium chips. The corresponding organometallic compounds, i.e., bis(isopropylcyclopentadienyl)magnesium, bis(isopropylcyclopentadienyl)calcium, and bis(isopropylcyclopentadienyl)barium, are obtained.

EXAMPLE 4

Chemical Vapor Deposition

A gas-tight horizontal reactor having inlet and outlet ports and a glass substrate mounted therein, is depressured to a pressure of 250 torr, and the substrate is heated resistively to a temperature of 800° C. A block of graphite is used as the susceptor. The reactor is purged with hydrogen. A stream of carrier gas (hydrogen) is bubbled through a pool of bis(isopropylcyclopentadienyl)magnesium, which is at a temperature of 75° C. The carrier gas flow rate is 1000 sccm. The resulting gas stream, containing about $1.5 \times 10^{-4}$ mole fraction of precursor in the carrier gas, continuously flowed into the reactor while the substrate temperature is maintained at 800° C. A magnesium film deposits on the surface of the substrate. Carrier gas with some unreactive precursor therein is continuously withdrawn through the outlet port of the reactor. A magnesium film about 2 microns thick is deposited in one hour. The reactor is then again purged with hydrogen, and then with nitrogen, and is then allowed to cool. The substrate with the magnesium film deposited thereon is removed from the reactor.

EXAMPLE 5

The procedure of Example 4 is repeated except that equivalent amounts of bis(isopropylcyclopentadienyl)calcium, bis(isopropylcyclopentadienyl)strontium and bis(isopropylcyclopentadienyl)barium, are substituted in turn for bis(isopropylcyclopentadienyl)magnesium. Films of calcium, strontium and barium, respectively, are formed on the surface of the substrate. While these films deposit in pure metal form, they are quickly oxidized in air to the corresponding oxides when the substrates are removed from the reactor.

EXAMPLE 6

This example describes deposition of a barium selenide film on a glass substrate. The procedure of Example 4 is followed except that separate streams of bis(isopropylcyclopentadienyl)barium and diethylselenide, both in concentrations of about $2 \times 10^{-4}$ (mole fraction) in carrier gas (hydrogen), are flowed into the reactor at flow rates of about 500 sccm. Flow of precursors in carrier gas streams is continued for 1 hour. A film of barium selenide, 3.5 microns thick, builds up during this time. After the flow of precursors has been stopped, the reactor is purged with hydrogen and then with nitrogen, cooled and the coated substrate removed as in Example 4. The resulting barium selenide film exhibits semiconductor properties as shown by standard tests.

EXAMPLE 7

This example described deposition of a thin film of barium titanate on a glass substrate. The procedure of Example 4 is followed, except that separate streams of bis(isopropylcyclopentadienyl)barium in carrier gas, titanium isopropoxide in carrier gas (hydrogen), and carbon dioxide/hydrogen mixture are introduced into the reactor and directed towards the substrate. Mole fractions of barium and titanium precursors and their respective gas streams are each $5 \times 10^{-4}$. The mole fraction of carbon dioxide in the carbon dioxide/hydrogen stream is about $10^{-2}$. A film of barium titanate is deposited at the rate of about 1.6 microns per hour. The reactor is purged and the coated substrate removed as described in Example 4.

While in accordance with the patent statutes only the best mode and preferred embodiment of the invention has been illustrated and described in detail, it is to be understood that the invention is not limited thereto or thereby, but that the scope of the invention is defined by the appended claims.

What is claimed is:

1. A chemical vapor deposition process for depositing a metallic coating on a heated substrate by thermal decomposition of an organometallic compound, said process comprising contacting an organmetallic compound of the formula

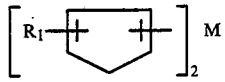

where M is magnesium, calcium, strontium or barium or a mixture thereof and R is an alkyl or alkenyl radical containing from 2 to about 6 carbon atoms, with said heated substrate, said substrate being at a temperature above the decomposition temperature of said organometallic compound.

2. A process according to claim 1 in which M is calcium, strontium or barium.

3. A process according to claim 1 in which R contains from 2 to about 4 carbon atoms.

4. A process according to claim 1 in which R is an alkyl radical.

5. A process according to claim 1 in which R is isopropyl.

6. A process according to claim 1 in which said organometallic compound is supplied in a stream of carrier gas.

7. A process according to claim 6 in which said carrier gas is a non-oxidizing carrier gas and said substrate is in a non-oxidizing atmosphere.

8. A process according to claim 1 in which the temperature of said substrate is from about 150° to about 1000° C.

9. A process according to claim 1 in which said coating has a thickness not greater than about 100 microns.

10. A process according to claim 1 in which said metallic coating comprises a metal compound, said process further comprising contacting an oxidizing agent with said substrate.

11. A process according to claim 1 in which said metallic coating comprises at least two metals or metal compounds, said process further comprising contacting a second organometallic compound, which on decomposition yields a second metal, with said substrate.

12. A process according to claim 1 in which said coating comprises an intermetallic compound.

13. A process according to claim 12 in which said intermetallic compound is barium selenide.

14. A process according to claim 11 further comprising contacting an oxidizing agent with said substrate.

15. A process according to claim 11 in which the metal M is barium, said second organometallic compound is a source of titanium, said oxidizing agent is an oxygen source and said metallic coating consists of barium titanate.

16. A process according to claim 1 in which both alkylcyclopentadienyl groups in said organometallic compound are the same.

* * * * *